United States Patent
Stauffer et al.

(10) Patent No.: US 7,290,238 B2
(45) Date of Patent: Oct. 30, 2007

(54) METHOD, SYSTEM AND PROGRAM PRODUCT FOR BUILDING AN AUTOMATED DATAPATH SYSTEM GENERATING TOOL

(75) Inventors: David R. Stauffer, Essex Junction, VT (US); Jeanne Trinko-Mechler, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 10/709,528

(22) Filed: May 12, 2004

(65) Prior Publication Data
US 2005/0257179 A1    Nov. 17, 2005

(51) Int. Cl.
  *G06F 17/50*    (2006.01)
(52) U.S. Cl. .................................................... 716/18
(58) Field of Classification Search ............... 716/10, 716/4, 5, 12–14, 18
  See application file for complete search history.

(56) References Cited

U.S. PATENT DOCUMENTS

| | | | | |
|---|---|---|---|---|
| 5,757,653 | A * | 5/1998 | Christian et al. ............... | 716/4 |
| 5,910,895 | A * | 6/1999 | Proskauer et al. ........... | 700/121 |
| 6,298,468 | B1 * | 10/2001 | Zhen ............................. | 716/2 |
| 6,425,109 | B1 * | 7/2002 | Choukalos et al. ............ | 716/1 |
| 6,477,691 | B1 * | 11/2002 | Bergamashi/Rab et al. ... | 716/12 |
| 6,868,513 | B1 * | 3/2005 | Botala et al. ................ | 714/738 |
| 2003/0167161 | A1 * | 9/2003 | Katz et al. .................... | 703/14 |
| 2004/0073856 | A1 * | 4/2004 | Bassett et al. .............. | 714/727 |
| 2005/0198601 | A1 * | 9/2005 | Kuang et al. .................. | 716/6 |

* cited by examiner

*Primary Examiner*—Jack Chiang
*Assistant Examiner*—Suchin Parihar
(74) *Attorney, Agent, or Firm*—Richard M. Kotulak; Hoffman, Warnick & D'Alessandro LLC

(57) ABSTRACT

An automated bit-sliced datapath system generating tool is built so design can be performed at a higher level, and automated generation of the synthesizable HDL representation can be accomplished are disclosed. A method defines datapath system characteristics, defines core/pin rules, and then constructs class-type inference rules that can be used for automatically generating the datapath system. An "orthogonal bundling" technique is used that groups pin by a class, and also by a channel identifier. The class-type inference rule corresponding to each class uses of the following factors to infer appropriate wiring: 1) number and type of pins in the class created by the instantiation of cores by the user; 2) attribute definitions on pins set by library core/pin rules; 3) user selection of "global attributes"; 4) user definition of channel bit order ("link orders") to imply the order of connection between stages; and 5) user-defined attributes set on pin classes.

20 Claims, 5 Drawing Sheets

METHOD, SYSTEM AND PROGRAM PRODUCT FOR BUILDING AN AUTOMATED DATAPATH SYSTEM GENERATING TOOL

BACKGROUND OF INVENTION

1. Technical Field

The present invention relates generally to datapath systems, and more particularly, to a method, system and program product for building an automated datapath system generating tool.

2. Related Art

As silicon technologies offer constantly increasing levels of integration, application specific integrated circuit (ASIC) designers are continually challenged to increase productivity and produce larger and larger designs with the same or less resources. Use of ASIC macros that each include a predetermined structure for a part of an ASIC and can be used repetitively is one technique for addressing this challenge. Use of such ASIC macros eliminates the need for the ASIC designer to design sections of the chip, and therefore improves productivity. As a result, design reuse methodology involving the use of ASIC macros provided by legacy designs, third party vendors or the ASIC vendor, has become an essential part of ASIC design.

The provider of such ASIC macros is challenged to provide a product that has been partitioned to provide maximum flexibility in meeting a wide range of requirements. The goal is to provide a single macro design that can be used in a wide range of ASIC designs without modification. Meeting this challenge requires the macro function to be partitioned such that some work is left to the ASIC designer to customize the configuration of the macro for a given application. For instance, an ASIC SRAM macro may be available in sizes up to 16,000 words by 128 bits wide because of subarray sizes that are reasonable to build as stand-alone cells in the technology. As a result, an application requiring a 32,000 by 256 bit memory must interconnect four such macros. In this case, the actual interconnection of macros would be manually performed by an ASIC designer. Another more complex application where a similar configuration is required relates to a bit-sliced datapath system including multiple high-speed serial input/output (I/O) channels, clock domain crossing first-in-first-out (FIFO) macros, and protocol logic macros. A bit-sliced datapath system relates to subsystems that support a variety of protocols including, for example, Infiniband, XAUI, PCI Express, Serial ATA, etc. To facilitate maximization of the use of ASIC macros, these subsystem components are supplied as separate macros such as: various High Speed Serializer/Deserializer (SerDes) macros supporting the basic serial I/O function (each macro supports N1 channels); separate clock domain crossing FIFO macros (each macro supports N2 channels); and separate protocol logic macros (each macro requires connection to N3 channels). Generically, N1, N2, and N3 are typically not equal. Also, the protocol logic macros may be further partitioned such that separate macros are provided for various protocol layers.

Subsystems as described above have typically required the ASIC designer to research information in the documentation for the ASIC macros, determine proper component interconnections, and then incorporate these components into the ASIC design as netlist instantiations. These macros also include many programmable functions and features that are used differently by each user depending on their application, which requires different pin connections or control. Many of these pins require connections to be made consistent with requirements imposed to support manufacturing test or IEEE 1149.1 Standard Test Access Port and Boundary-Scan Architecture (hereinafter "IEEE 1149.1"). It is not uncommon for the resulting subsystem to require the ASIC designer to make thousands of interconnections to integrate the ASIC macros. Design in this manner is tedious and error-prone, and often requires considerable support from the ASIC macro provider. However, because these interconnections are different for each ASIC design, ASIC macros cannot be supplied at a higher level of integration without defeating the goal of design reuse.

Various software products are available to automate subsystem interconnections for specific types of subsystems. For example, various suppliers of ASIC macros also supply "wrappers" with these macros to interconnect the macros and/or make appropriate test connections. Many of these suppliers have tools that automate the generation of these wrappers. However, these tools are generally dependent on hard-coded knowledge of specific types of subsystems, and thus are not extensible to more complex subsystems, or other target subsystems. There are software tools currently available that use knowledge derived from databases and are therefore more extensible. However, these tools rely on conventional bundling (as described below) to make interconnections. As will be described, such schemes are not optimal for the interconnection of datapath i/o systems, especially bit-sliced datapath systems.

High-level design languages (HDLs) exist that allow grouping of multiple ports of various classes on an ASIC macro into a structured class declaration, assignment of a type, and making one connection for all pins. For instance, a bus class can be declared that includes as elements of the structure all of the data, address, and control pins associated with the bus. The entity declaration can then make use of this class in pin definitions, and pins can be declared using this class. Unfortunately, this type of bundling is limited in that the pins must be assigned as an entire unit—so all pins have to be on the first macro and on the second macro. This conventional bundling technique reduces the number of apparent pins on the entity, and reduces the number of interconnections that must be made between components in the design. For subsystems containing cores for which the prevalent interconnections are busses, this technique can substantially reduce the number of interconnections. In a datapath system, data is bit sliced, which means there is no one-to-one correspondence between macro pins. Accordingly, conventional bundling is less effective in datapath systems because macros in such systems often consist of a myriad of sideband control/status pins that do not lend themselves to traditional bundling. In addition, conventional bundling does not permit the bundle of pins to be bit sliced across multiple macro instantiations.

Conventional bundling, as described above, also requires rigid pin declarations as to the contents of the bundle, and requires explicit interconnection of one bundled pin to another bundled pin. Some software tools have used pin attributes and algorithmic approaches to somewhat relax the need for rigid pin declarations. These tools use the equivalent of type names, indices, and pin characteristics to bundle pins. However, these tools still requires explicit interconnection of one bundled set of pins to another bundled set of pins. Some of these tools can, however, apply class-type inference rules based on pin attributes within the bundles to determine the correct interconnections. This allows the bundle definition to be less rigid. For instance, a bundle containing a 16-bit data bus can be connected to a peripheral unit, which only supports an 8-bit data bus, and the correct interconnection is inferred.

In view of the foregoing, there is a need in the art for a method to more fully leverage ASIC macros that does not suffer from the problems of the related art.

SUMMARY OF INVENTION

The invention includes a method, system and program product for building an automated bit-sliced datapath system generating tool so design can be performed at a higher level, and automated generation of the synthesizable HDL representation can be accomplished. A method defines datapath system characteristics, defines core/pin rules, and then constructs class-type inference rules that can be used for automatically generating the datapath system. An "orthogonal bundling" technique is used that groups pin by a class, and also by a channel identifier. The class-type inference rule corresponding to each class uses of the following factors to infer appropriate wiring: 1) number and type of pins in the class created by the instantiation of cores by the user; 2) attribute definitions on pins set by library core/pin rules; 3) user selection of "global attributes"; 4) user definition of channel bit order ("link orders") to imply the order of connection between stages; and 5) user-defined attributes set on pin classes.

A first aspect of the invention is directed to a method for building an automated datapath system generating tool for a datapath system including bit-sliced data between at least one source stage and at least one subsequent stage that are connected across a channel, the method comprising the steps of: defining at least one system characteristic; generating a core/pin rule for the design that defines each core of the design, each pin of each core and corresponding pin attributes; and constructing class-type inference rules for automatically generating the datapath system, each class-type inference rule executing at least one primitive function.

A second aspect of the invention is directed to a system for building an automated datapath system generating tool for a datapath system including bit-sliced data between at least one source stage and at least one subsequent stage that are connected across a channel, the method comprising the steps of: means for defining at least one system characteristic; and means for generating a core/pin rule for the design that defines each core of the design, each pin of each core and corresponding pin attributes; means for constructing class-type inference rules for automatically generating the datapath system, each class-type inference rule executing at least one primitive function.

A third aspect of the invention is directed to a computer program product comprising a computer usable medium having computer readable program code embodied therein for building an automated datapath system generating tool for a datapath system including bit-sliced data between at least one source stage and at least one subsequent stage that are connected across a channel, the program product comprising: program code configured to define at least one system characteristic; program code configured to generate a core/pin rule for the design that defines each core of the design, each pin of each core and corresponding pin attributes; and program code configured to construct class-type inference rules for automatically generating the datapath system, each class-type inference rule executing at least one primitive function.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

For organizational purposes only, the following detailed description includes the following subtitles: I. Datapath System Overview and Pin Bundling Hierarchy; II. Operational Methodology; III. Operation; and IV. Conclusion.

The present invention includes a system, method and program product for building an automated datapath system generating tool such that the design can be performed at a higher level, and automated generation of the synthesizable HDL representation can be accomplished. For purposes of description, one illustrative datapath system that will be continually referenced relates to interconnection of High Speed Serializer/Deserializer (hereinafter "HSS") subsystems including macros and associated protocol layers and phase-locked loop (PLL) cores. It should be recognized, however, that the teachings of the invention are in no way limited to this particular application.

I. Datapath System Overview and Pin Bundling Hierarchy

Figure 1:
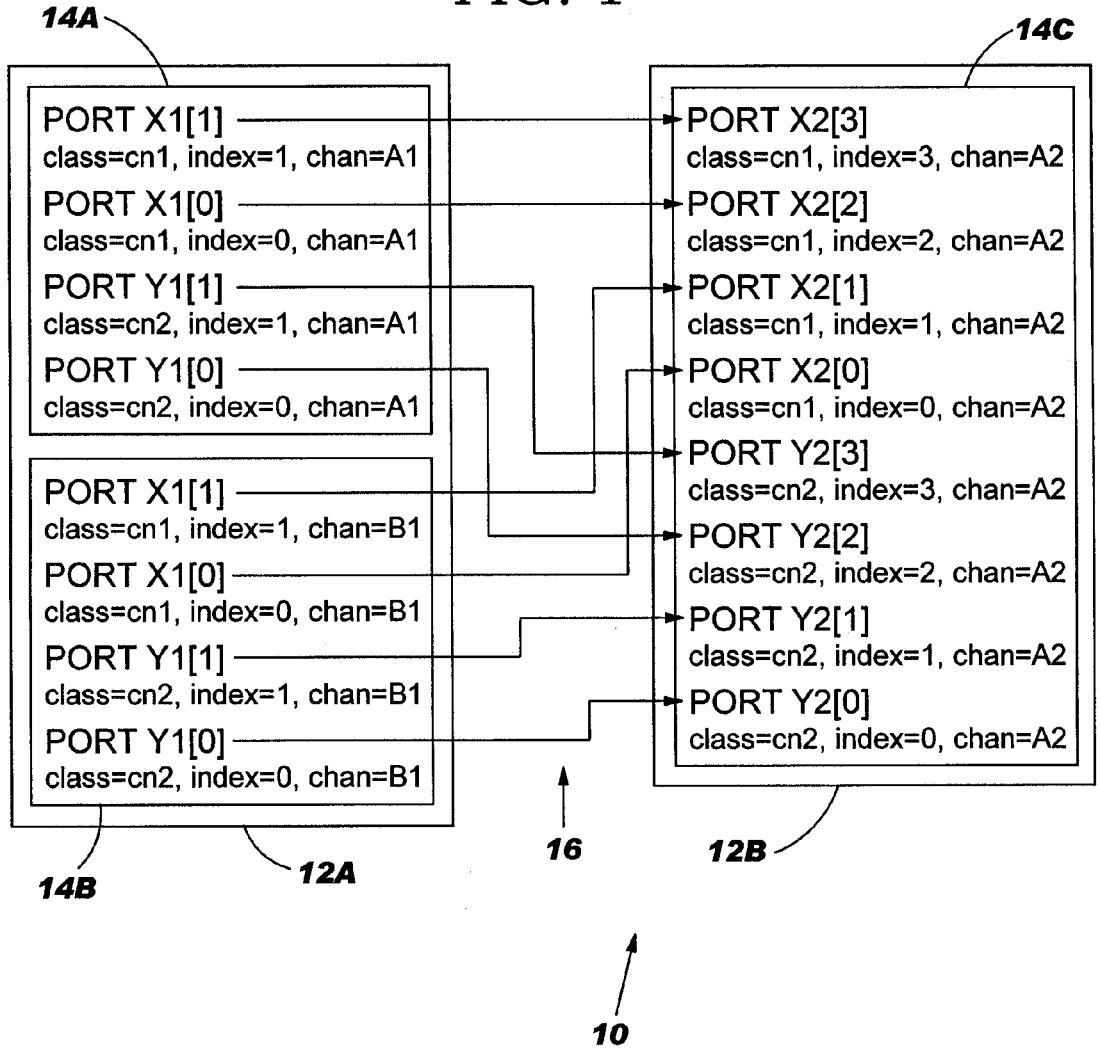
FIG. 1 shows stages of a datapath system.
Figure 2:
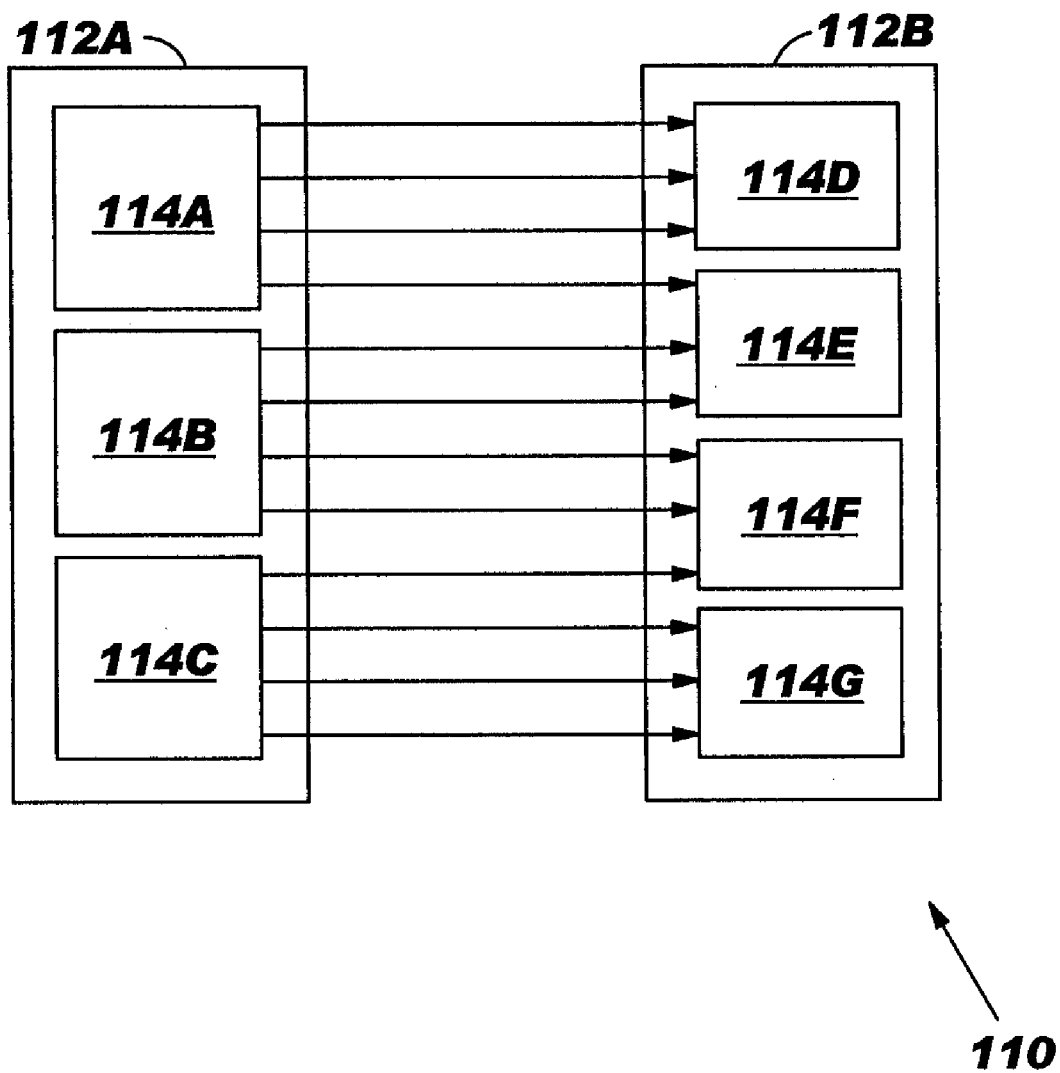
FIG. 2 shows stages of another datapath system.

Referring to FIG. 1, an illustrative datapath system 10 is shown that includes a series of stages 12A, 12B. Each stage 12A, 12B performs processing on input data and generates output data that is then connected to a next or subsequent stage. Each stage 12A, 12B of the datapath includes one or more ASIC macros or cores 14 (referred to hereinafter as "cores") that perform the function associated with that stage. Each core 14 receives or outputs signals via pins (e.g., port X1[1], port X1[0], port Y1[1], etc.). (It should be recognized that the teachings of the invention could also be described in terms of signals carried by the pins. However, for clarity, the invention will be described in terms of the pins.) Stages 12 are coupled across channels 16. FIG. 1 illustrates one example datapath system 10 that includes a source stage 12A that includes two cores 14A, 14B, and a subsequent or next stage 12B that includes one core 14C. FIG. 2 illustrates a more complex example datapath system 110 that includes a source stage 112A that includes three cores 114A, 114B, 114C, each with three output pins, that feeds to a subsequent stage 112B that includes four cores 114D, 114E, 114F, 114G, each with three input pins. Each core 14 in a stage provides processing for a bit slice of the datapath. The overall datapath width must be consistent from stage to stage of datapath system. However, the width of the bit slice processed by cores 14, 114 at various stages of datapath system may vary.

Figure 3:
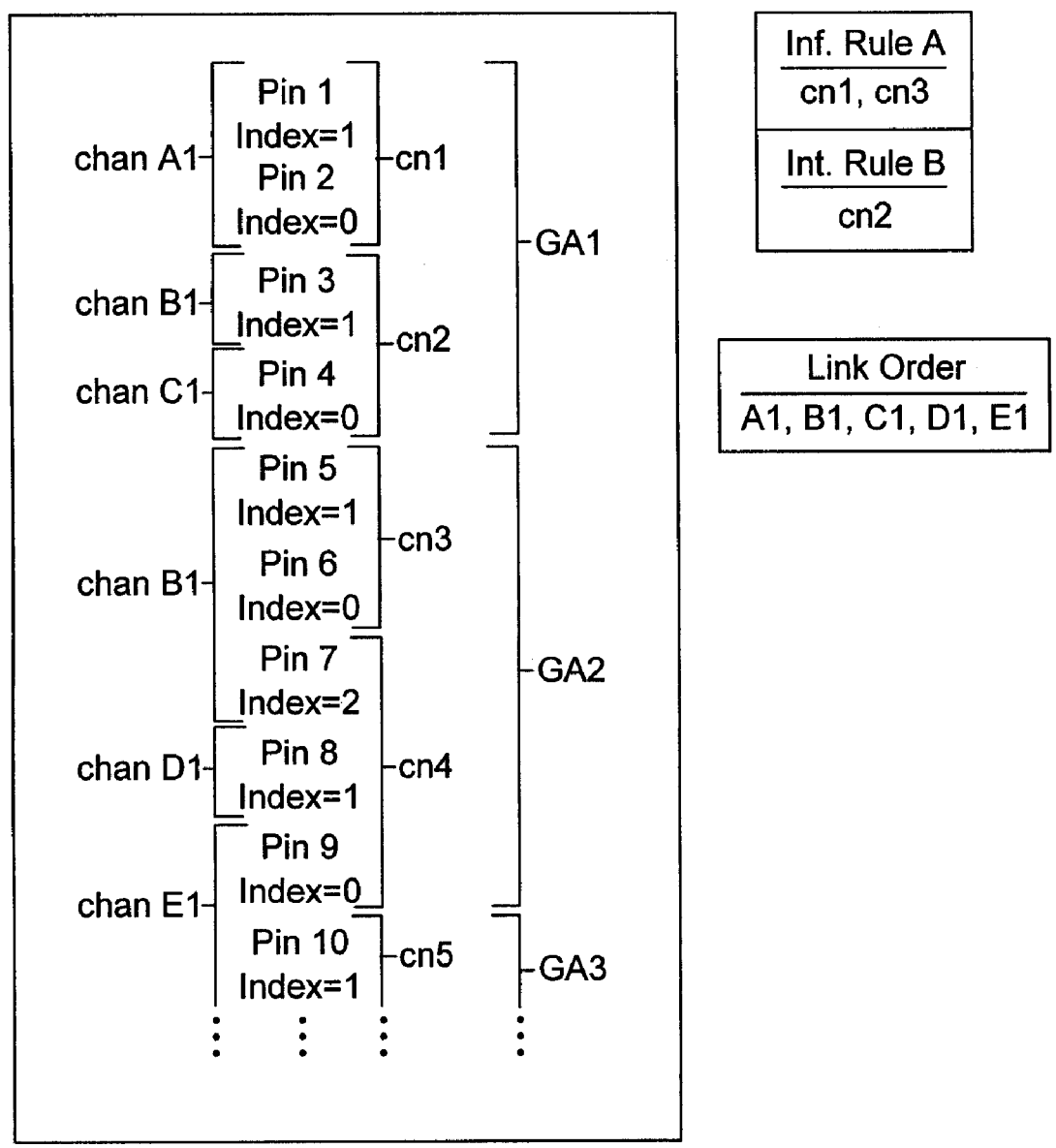
FIG. 3 shows data structure for a bundling hierarchy according to the invention.

Referring to FIG. 1 in conjunction with FIG. 3, a bundling hierarchy according to the invention for pins to organize the characteristics of datapath system 10 will now be described. FIG. 3 illustrates a number of pins Pin1-Pin10. The invention uses rule-based "pin attributes" that provide the bundling hierarchy. One pin attribute is a "class," which groups or bundles pins of cores that may be wired according to an class-type inference rule. As shown in FIG. 3, each class is associated with a class-type inference rule, which is used to perform wiring operations on the class, i.e., each pin of a given class is wired by execution of the corresponding class-type inference rule. A common class-type inference rule may, for example, wire input pins of the class to output pins, wire pins of the class to control or status register bits, or wire pins of the class to a subsystem I/O. Each class is identified by a unique "class name," which is a unique name of the class of pins to which the pin belongs. For example, "cn1," "cn2," (FIGS. 1 and 3) "cn3," "cn4," "cn5" (FIG. 3 only), or some other convenient naming protocol, may be used. Pins that are interrelated and are to be wired as part of a common execution of a class-type inference rule must have the same class name. Class names are selected in arbitrary order for wiring by execution of the corresponding class-type inference rule. Within a class, if a core has multiple pins that belong to the same class and have the same channel ID attribute (such as would be the case for a set of pins on a core that are defined by a multi-bit vectored port), then a "vector index" (hereinafter simply "index") pin attribute defines the ordering of these pins. The higher the index, the higher the significance of the bit, e.g., in FIG. 1: index 1 comes first, and index 0 comes second. Other pin attributes referred to herein as "rule-defined wiring actions" that have meaning to the class-type inference rules may also be implemented. These rule-defined wiring actions may, for example, be used to assign default wiring actions, indicate required test structures or divide pins of a class into sub-class-types.

A next level of pin attribute is a "channel identifier" (hereinafter "channel ID"), which provides another mechanism to group or bundle pins other than by class. Channel identifiers are indicated in FIGS. 1 and 3 as "chan 1," "chan 2," etc. As shown in FIG. 3, channel ID is not unique to a class, and can span classes associated with that channel. In one example, a channel ID may represent an individual serial transmit or receive channel on an HSS core. Cores may bundle with more than one channel in a single core in which case the channel ID is used to associate the pin to a given channel. As will be described in more detail below, use of a class and a channel ID allow for what is referred to herein as "orthogonal bundling" because channel IDs implement a bundling of pins that is orthogonal to the bundling of pins by class.

In addition to the above-described pin attributes, the invention may also implement a "global attribute," which provides another mechanism to group or bundle classes. Global attributes are indicated in FIG. 3 as "GA1," "GA2," "GA3," etc. Furthermore, "user defined wiring actions" (not shown) may be implemented. In particular, in some cases, the user is permitted to select between several options for wiring interconnections. User defined wiring actions are arbitrary attributes that have meaning to the class-type inference rules (FIG. 3) that specify which option is to be used. The user may assign user defined wiring actions to individual pins, but more typically assigns these attributes to all pins of a class.

A "link order" is a user-specified instruction that prioritizes channel IDs within a stage and, in conjunction with the above-described pin attributes, defines how to concatenate bit slices across channels for the datapath system, i.e., how to connect pins of one stage to pins of another stage. A unique link order name is assigned to each stage of the datapath system, and this name is built into the class-type rules. In one embodiment, each channel in each stage of the datapath system has a corresponding link ID name, which is formed by concatenating the instance name of the core and the channel ID. The user therefore specifies a list of link IDs (most significant bit to least significant bit) that correspond to a given link order name. As shown in FIG. 3, a link order is specified by a user as a sequence of channel IDs, e.g., A1, B1, C1, D1, E1.

To illustrate how the above-described pin attributes along with a link order can generate a datapath system, reference is made to FIG. 1. In this example, a first, source stage 12A includes two cores 14A, 14B that cumulatively includes pins: port X1[1:0] and port Y1[1:0]. Note, the numbers in brackets indicate the index for that particular pin, and index values separated by a colon ":" indicate a series of such index values. As noted above, the index values specify ordering of pins within a class. The class name "cn1" implies that pins port X1[1:0] on first stage 14A are bundled with the X2[3:0] ports of second stage 14C. Likewise, the "cn2" class name associates pins port Y1[1:0] and port Y2[3:0]. A second, subsequent stage 14C provides a bit slice two channels wide, and includes pins: port X2[3:0] and port Y2[3:0]. The channel IDs "A1" and "B1" implement a bundling of pins which is orthogonal to the bundling of pins by class name. Of the two channels shown in the first stage of the datapath, the X1[1:0] and Y1[1:0] ports of the upper channel are grouped as channel "A1," and the X1[1:0] and Y1[1:0] ports of the lower channel are grouped as channel "B1." Note that the definition of the width of a "channel" does not need to be consistent between stages of the datapath; the second stage of the datapath groups all ports as channel "A2" in this example. For purposes of description, assume that the user has specified "link orders" for each stage as follows: for first stage 12A: A1, B1, and for second stage 12B: A2.

The grouping of pins by class in combination with the grouping of pins by channel ID allows class-type inferences to be made concerning the correct wiring of the system. The "cn1" class name groups together pins: port X1[1:0] and port X2[3:0]. Furthermore, the link order and index pin attributes permit the ordering of input and output pins to be inferred. Pins are assigned according to class, then channel ID, and then index within a class. For example, output pins from stage 12A would be ordered, for class cn1: port X1[1] of channel ID A1 (most significant bit), port X1[0] of channel A1, port X1[1] of channel B1, and port X1[0] of channel B1 (least significant bit). This results in input pins for stage 12B as follows: port X2[3] of channel A2 (most significant bit), port X2[2] of channel A2, port X2[1] of channel A2, and port X2[0] of channel A2 (least significant bit). These vectors can then be connected together, with port X1[1] of channel A1 connected to pin X2[3] of channel A2, etc. Similar class-type inferences can be made to wire class cn2 includes pins: port Y1[1:0] and Y2 [3:0] ports.

Returning to FIG. 2, as noted above, a more complex example of a datapath system 110 is illustrated. In this case, source stage 112A includes three cores 114A, 114B, 114C, each with three output pins, that feeds to a subsequent stage 112B that includes four cores 114D, 114E, 114F, 114G, each with three input pins. That is, twelve channels in total. Each core 114A, 114B, 114C in first stage 112A must drive pins to more than one core 114D, 114E, 114F, 114G in second stage 112B. Also, it is likely that cores in second stage 112B will receive pins from more than one core in first stage 112A. The example shown precludes conventional bundling of pins with granularity such that the width of the bundle is greater than one channel. However, orthogonal bundling, as described above, using a link order permits the wiring of all 12 channels to be inferred as a single operation.

II. Methodology

Referring to the flow diagram of FIGS. 4A-4B, the methodology of the invention to implement the above-described bundling hierarchy to automatically generate a datapath system will now be described.

As a brief overview, the method includes the following steps, which will be described in more detail below:

STEP S1: Define at least one datapath system characteristic.

STEP S1A: Define the set of cores which are legal elements of the target system, and the stage of the datapath at which each core may be used.

STEP S1B: Define link order name for each datapath stage. A link order, which as indicated above represents the channel ordering at each stage of the datapath, will be established by a user and assigned to the link order name when using the system.

STEP S1C: Identify any system modes of operation or system configurations that may affect multiple pin classes, and therefore lend themselves to implementation with global attributes. Define global attribute names and corresponding legal values that correspond to these modes and configurations.

STEP S2: Generate core/pin rules. A "core/pin rule" is a rule that defines each core, the pins on each core and corresponding pin attributes. That is, a core/pin rule implements orthogonal bundling, as described above.

STEP S2A: Group or bundle pins of cores, i.e., classify the pins, into sets of pins indicating a common wiring parameter such as the pins are to be wired together or otherwise wired as a single operation. In addition, a unique class name is assigned to each such group of pins.

STEP S2B: Categorize each class of pins into one of the general class-types of pins in datapath systems, or identify the pin class as being a special case. Assign correspondence for the class name to class-type for which an class-type inference rule will be built based on this categorization.

STEP S2C: Assign vector index and channel ID attributes based on the function of the pin.

STEP S2D: Assign additional arbitrary pin attributes as needed based on requirements for the class-type inference rules.

STEP S2E: Generate core/pin rules that define each core, the pins on each core, and the corresponding pin attributes.

STEP S3: Construct class-type inference (class-type) rules for the datapath system. This step includes constructing class-type inference rules for automatically generating the datapath system, each class-type inference rule using at least one primitive function necessary to support execution of the class-type inference rules. A class-type inference rule is constructed for each class-type as indicated by each general class-type of pins in datapath systems, plus special cases (if any).

STEP S4: Establish Primitives. If primitives are not already built, the method may include the step of establishing a set of primitives necessary to support execution of the class-type inference (class-type) rules.

1. First Step: Define at Least One Datapath System Characteristic

Figure 4A:
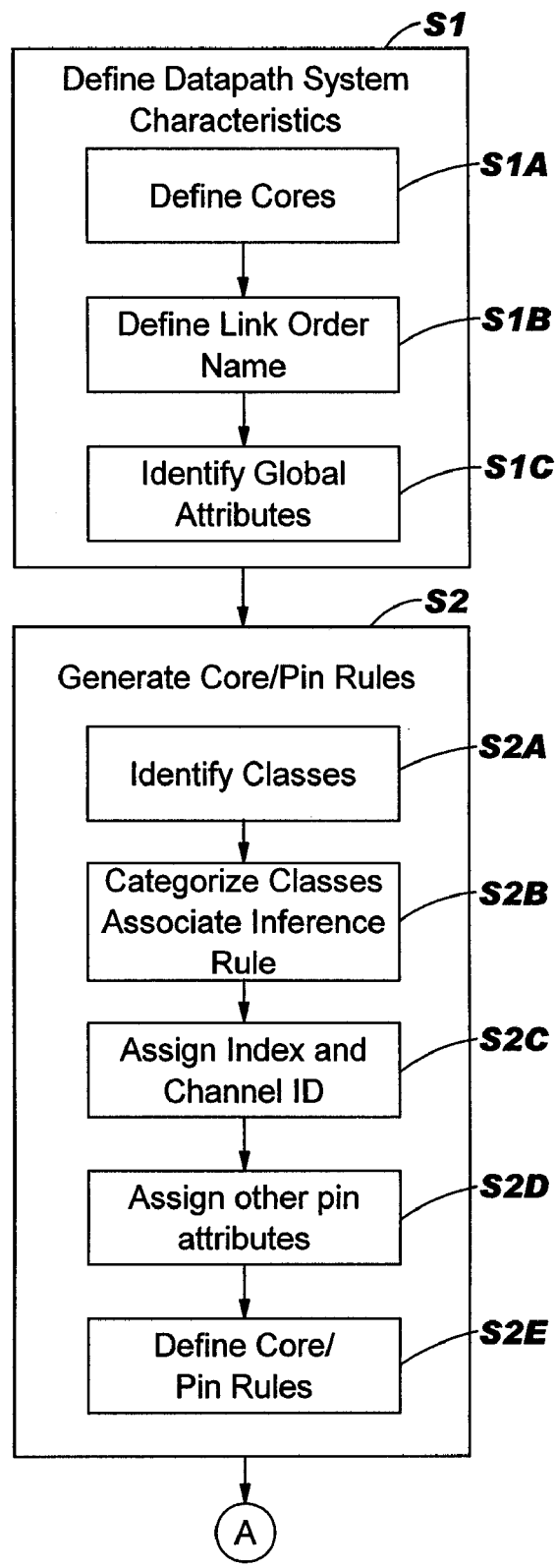
FIGS. 4A-4B show a flow diagram of operational methodology according to the invention.

Referring to FIG. 4A, in a first step S1, at least one datapath system characteristic is defined. This step may include three sub-steps S1A, S1B and S1C, as will be described below.

In step S1A, a set of cores that are legal elements of the target datapath system are defined, and the stage of the datapath system at which each core may be used is defined. As noted above, datapath systems include a series of stages, each stage of which performs processing on input data and generates output data that is then connected to the next stage. Each stage of the datapath includes one or more ASIC cores that perform the function associated with that stage. Each ASIC core in the datapath provides processing for a bit slice of the datapath, and multiple cores may be connected in parallel to obtain the desired datapath width. The overall datapath width must be consistent from stage to stage of the datapath system, however the width of the bit slice processed by cores at various stages of the datapath may vary.

Often, the "datapath width" terminology is used to refer to the number of discrete bits in the datapath. However, the terminology shall be used herein to refer to the number of channels in the datapath, where a "channel" is an indivisible quantum of the datapath as determined by the application. The number of bits associated with a single "channel" may vary at various stages of the datapath, as would occur for instance if one of the stages of the datapath performed a 1:n demultiplexor or n:1 multiplexor function.

In the illustrative application, HSS subsystems, there are two datapaths: an ingress path and an egress path. Each of these two paths may include two stages: a stage consisting of HSS cores that receive/transmit the high speed signals and demultiplex/multiplex the data, and an optional stage consisting of protocol cores, i.e., logic cores that implement a protocol associated with one of several standard applications. An HSS channel consists of the processing associated with one high speed signal, which corresponds to a datapath width of 8 or more bits between the HSS cores and the protocol cores.

In step S1B, a user defines a link order name for each datapath stage. In one embodiment, this sub-step includes analyzing typical system configurations to determine the possible numbers of datapath stages, and which ASIC cores are to be used in each stage. Each required or optional datapath stage is then assigned a unique link order name. Further, a name for the link order that represents the channel ordering at each stage of the datapath is defined. The result of this analysis is a list of valid link order names that may be populated by a user during use of the tool. An additional output for each link order name is the list of cores that are valid in the corresponding stage of the datapath.

In step S1C, any system modes of operation or system configurations affecting multiple pin classes that can be implemented with global attributes are defined. In this case, typical system configurations are analyzed to determine whether standard configurations exist that relate to many classes of pins. The result of this analysis is a list of global attributes and their valid values that are valid for the targeted datapath system. In one example, if IEEE 1149.1 is required, then various sets of pins on HSS cores must be connected in the configuration necessary to implement IEEE 1149.1. If IEEE 1149.1 is not a requirement, then these pins may all be tied to inactive logic levels. A global attribute is used to define whether the system is required to support IEEE 1149.1. The value of this global attribute is then used to force correct connections. Also, global attribute names and corresponding legal values that correspond to these modes and configurations may be defined.

2. Second Step: Define Core/Pin Rules

In a second step S2, core/pin rules are defined. This step includes five sub-steps: S2A, S2B, S2C, S2D and S2E, as will be described below. In general, step S2 implements the orthogonal bundling technique described above.

In step S2A, classes of pins are identified by grouping or bundling sets of pins that have a common wiring parameter such as requiring wiring together, or otherwise require wiring as a single operation. In particular, groupings of pins on the same core, similar cores, or cores in adjacent datapath stages that may be connected together under various sets of conditions are defined. Note that vectored ports of a core are grouped in the same class. A unique class name, e.g., cn1, cn2, etc., is assigned to each class. For cores that support multiple channels, similar pins on different channels are part of the same class.

For the illustrative application, the pins associated with any given datapath core can be classified into the following general class-types:

A. Functional Datapath: Pins used to input/output functional data are considered to be part of the functional datapath. It can be inferred that inputs to the first stage of the datapath should be connected to primary inputs of the subsystem netlist, outputs of the first stage of the datapath should be connected to inputs of the second stage of the datapath, and so forth. Outputs of the last stage of the datapath should be connected to primary outputs of the subsystem netlist. Therefore, for a given class name that represents a set of pins belonging to this class-type, if both inputs and outputs of the class exist, then it can be inferred that the outputs of one stage should be wired to the inputs of the next stage.

Additional class-type inferences can be made using information provided by the user. For example, the bit order for the channels at each stage of the pipeline, and the selection of any "modes" which may globally affect usage of some pins may be provide. For instance, an HSS core may provide 10 datapath pins on the inboard interface. The core may operate in either an 8:1 or 10:1 mux/demux mode; and in the 8:1 mode two of the datapath pins are unused. In one embodiment, the definition of "link orders" and "global attributes" by the user provides this information where applicable.

Class-type inference rules for the "functional datapath" therefore infer the desired wiring by: 1) determining the structure of the class, e.g., how many input pins and output pins exist; 2) determining the correct order of the pins, e.g., based on the applicable link orders; and 3) determining whether any global attributes indicate some pins should be left unused. Pins are then wired to either the previous (or subsequent) stage, or to primary inputs (or outputs) of the subsystem netlist.

B. Datapath Control/Status:

This class-type includes control (status) pins for which: 1) one pin, or a set of pins, are associated with each channel, and 2) the control (status) pin asserts cycle-by-cycle control (indicates cycle-by-cycle status) for data on the datapath. Examples of such pins include error injection functions, synchronization signals, or bit error status indications. Datapath control/status signals may flow in the direction of the datapath flow, or may flow counter to the direction of the datapath flow. For a given class name that represents pins belonging to this class-type, if both inputs and outputs of the class exist then it can be inferred that the outputs should be wired to the inputs. Bit ordering for input pins and output pins is determined by the respective "link order" definitions.

If only inputs or only outputs of the class exist, then there are no matching connections to perform the wiring. In this case, the desired subsystem wiring is typically one of the following options: 1) input signals may be tied inactive (or outputs may be left unconnected); 2) control signals may be driven from channel control registers (or status signals may be latched in channel status registers); or 3) control signals may be driven from primary input ports (or status signals may drive primary output ports) of the subsystem netlist. The user must select among these options for the pin class by setting the corresponding "user defined wiring actions," or accept the default action.

To further illustrate, a typical case for Channel Control/Status (typical case) will now be described. This class-type consists of control (status) pins for which 1) one pin, or a set of pins, are associated with each channel, 2) the control (status) pin selects a general mode of operation (indicates a general status condition) for the channel, and additionally, the function of the pins is such that independent control (independent monitoring) of each channel is always required. Examples of such pins include loopback mode control pins, phase rotator control pins, or signal-detect status. Typically, classes of control signals consist of only inputs, and classes of status signals consist of only outputs. However, there are cases where these signals are driven between stages of the datapath to ensure coordinated operation of a control action (or correct response to a status condition). Therefore, for a given class name that represents pins belonging to this class-type, if both inputs and outputs of the class exist then it can be inferred that the outputs should be wired to the inputs. Bit ordering for input pins and output pins is determined by the respective "link order" definitions. If only inputs or only outputs of the class exist, then there are no matching connections to perform the wiring. In this case, the options for the desired subsystem wiring are typically similar to the "Datapath Control/Status" class-type.

To further illustrate, a Channel Control (with optional common control) will now be described. This class-type consists of control pins for which: 1) one pin, or a set of pins, are associated with each channel, 2) the control pin selects a general mode of operation for the channel, and additionally the function of the pins is such that common control of all channels may be desirable in some cases. Examples of such pins include filter coefficients, or drive strength selection. Typically, classes of control signals consist of only inputs. However, there are cases where these signals are driven between stages of the datapath to ensure coordinated operation, or where all channels are driven from a common control core. Therefore, for a given class name that represents pins belonging to this class-type, if both inputs and outputs of the class exist then it can be inferred that the outputs should be wired to the inputs. Bit ordering for input pins and output pins is determined by the respective "link order" definitions. Either output pins are connected one-for-one to input pins, or a single output pin (or output pin vector) is connected to the input pin(s) for all channels. If only inputs of the class exist, then there are no matching connections to perform the wiring. In this case, the desired subsystem wiring is typically one of the following options: 1) input signals may be tied to the desired value; 2) control signals may be driven from channel control registers; 3) control signals may be driven from primary input ports of the subsystem netlist; 4) control signals to all channels may be driven from a common bit slice of the common control register; or 5) control signals to all channels may be driven from a common primary input port(s) of the subsystem netlist. The user must select among these options for the pin class by setting the corresponding "user defined wiring actions," or accept the default action.

C. Common Control/Status:

This class-type consists of control (status) pins for which: 1) one pin, or a set of pins, are associated with each core, and 2) the control (status) pin selects a general mode of operation (indicates a general status condition) for the core (for instance, PLL Divider control, or PLL Lock status). Typically, classes of control signals consist of only inputs, and classes of status signals consist of only outputs. However, there are cases where a core that is not part of a datapath stage sources signals for all inputs. Therefore, if both inputs and outputs of the class exist then it can be inferred that the outputs should be wired to the inputs. Since pins are not associated with specific channels, bit ordering for input pins and output pins is determined by vector index values only; pins with similar vector indices are wired together. If only inputs or only outputs of the class exist, then there are no matching connections to perform the wiring. In this case, the desired subsystem wiring is typically one of the following options: 1) input signals may be tied inactive (or outputs may be left unconnected); 2) control signals may be driven from separate bits of the common control register (or status signals may be latched in separate bits of the channel status register); or 3) control signals may be driven from primary input ports (or status signals may drive primary output ports) of the subsystem netlist. The following options are also available for control signals: 4) control signals to all sinks may be driven from a common bit slice of the common control register; or 5) control signals to all sinks may be driven from common primary input port(s) of the subsystem netlist. The definition of "user defined wiring actions" provides this information. The user must select among these options for the pin class, or accept the default action.

D. Test Pins:

This class-type includes pins used for manufacturing test, or to implement special test modes such as IEEE 1149.1. Such pins either have a fixed definition of the connection to be made, or have a limited set of options based on whether the test mode is to be implemented. A "global attribute" can be used to set whether or not the test mode is to be implemented. Class-type inference rules can then generate the necessary wiring based on this value.

E. Special Cases:

While almost all signals of the datapath subsystem will fall into one of the above class-types, there may be signals that require customized class-type inference rules. For example, the clock inputs of HSS cores must adhere to a limited set of valid configurations. Based on whether or not the user has instantiated PLLs, and based on user entry of "user defined wiring actions," the class-type inference rules can determine the desired configuration and build the necessary interconnections. Other special cases may include, for example, signals that must be daisy-chained within cores of a single stage.

The above descriptions of pin class-types indicate the types of actions that would be valid for pin classes of the given class-type. Class-type inference rules, as will be described below, can then be written that execute wiring for the class. Such class-type inference rules would first apply a set of checks to pins of the class to determine whether expected conditions are met (i.e. expected numbers of inputs and/or outputs, legal values for user defined wiring actions). If no errors are found, then wiring statements can be executed to wire the class, implementing the desired interconnection per the above descriptions. Additionally, if requirements exist to support manufacturing test, these requirements can also be incorporated.

In step S2B, each class is categorized into one of a plurality of general class-types, as described above, of pins in datapath systems or the class is identified as being a special case. Once categorized, each class is associated with a corresponding class-type, and a corresponding class-type inference rule, which will be generated. If none of the general class-types applies, then a custom class-type (and class-type inference rule) may be required. Steps for building class-type inference rules are described below.

In step S2C, a vector index and channel ID are assigned based on the functional descriptions of the pins. In particular, if pins within the class include vectored ports, then vector indices are assigned to each pin identifying the order of the pins. In addition, for cores that contain multiple channels, if pins within the class are associated with individual channels on the core (i.e., there is one pin or set of pins per channel), then a channel ID is assigned to the pin according to the channel ID nomenclature determined for the ASIC core. That is, pins are grouped or bundled according to at least one channel identifier, which is outside their classification. In one embodiment, arbitrary identifiers for channel IDs are assigned to each channel on the core. Channel IDs must be unique on a given core, but may use a similar nomenclature to other cores. An illustrative scheme for, for example, IBM HSS cores, is to use the letters A, B, C, etc. as channel IDs.

In step S2D, once a pin has been designated as a member of a particular class and has been associated with a class-type per step S2B, the pin may optionally be assigned a rule-defined wiring action, i.e., additional arbitrary pin attributes, to affect appropriate processing by a class-type inference rule. Each "rule-defined wiring action" may include, for example, a primary value and secondary modifier value, which are arbitrary text strings, the meanings of which are defined by a class-type inference rule.

In step S2E, core/pin rules are generated that define each core, the pins on each core, and the corresponding pin attributes. That is, the above-described pin attributes are coded. These rules define the following: 1) for each core: a. the core cell name, b. the datapath stage at which the core may be used; 2) for each pin on the core: a. the pin name, b. port direction (input, output, bidirectional), c. class name to which pin belongs, d. channel ID, if applicable, e. vector index, if applicable, f. rule-defined wiring actions value, if applicable; and 3) for each class name in the rule: an association to the corresponding class-type for which a class-type inference rule will be generated. It should be recognized that the invention is not dependent on a particular syntax for these rules, providing that the above information is somehow encoded in the rules.

3. Third Step: Construct Class-type Inference Rules

Figure 4B:
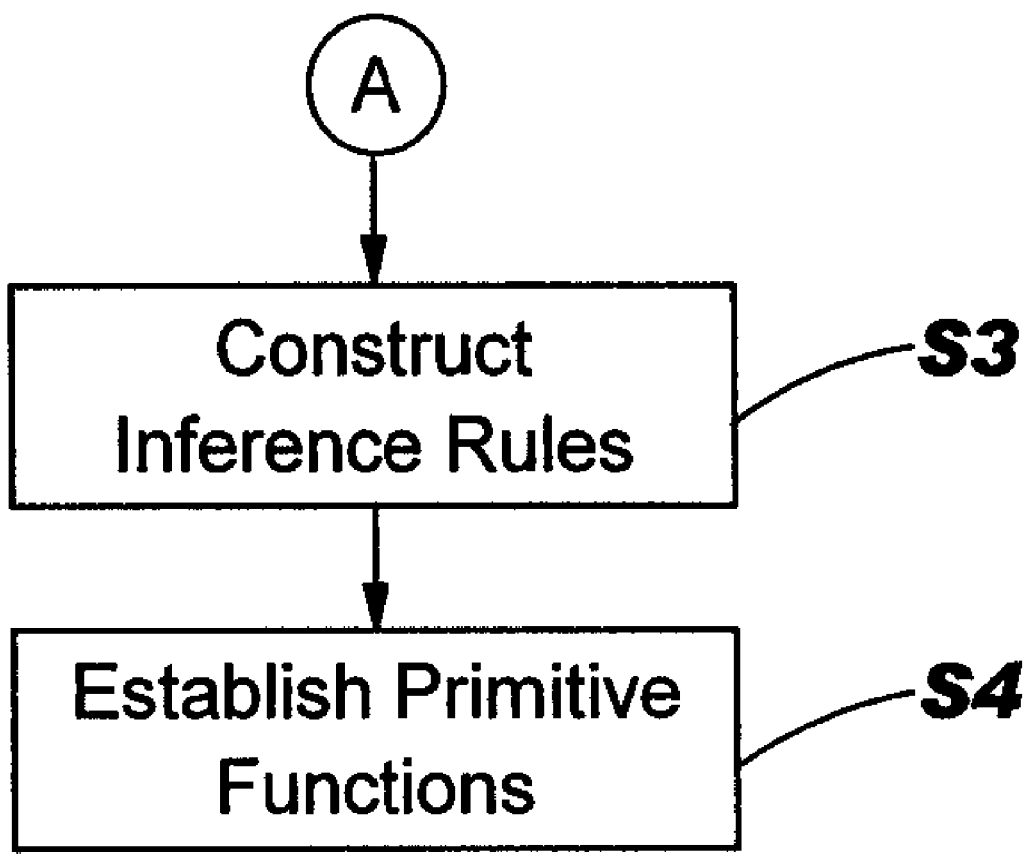

Turning to FIG. 4B, in a third step S3, class-type inference rules are constructed for automatically generating the datapath system, each class-type inference rule executes at least one primitive function. This step includes constructing class-type inference rules for each of the general class-types of pins in datapath systems, plus class-type inference rules for special cases (if any). The following description includes four parts: A. Overview of Syntax for Class-type Inference Rules, B. Execution of Class-type Inference Rules; C. Construction of Class-type Inference Rules (describes the step), and D. Primitives.

A. Overview of Syntax for Class-type Inference Rules

The general syntax for a class-type inference rule as used herein may be as follows:

```
class-type name_of_class-type_rule is
    legal_checks_actions begin
        legal_checks_statements
    end
    wiring_actions begin
        wiring_actions_statements
    end
end_class-type
```

It should be recognized, however, that the syntax may vary based on a number of parameters, e.g., language used, type of application, etc. The class-type inference rule includes two significant clauses:

First, the legal checks actions clause contains zero or more legal_checks_statements. These statements are used to test assumptions used when writing the class-type inference rule. If the system is not compliant with these assumptions, then execution of the wiring actions may produce unintended results. Rather than proceed with execution of the class-type inference rule under these conditions, wiring of the class-type is aborted and error messages are reported. Each legal checks statement has the following form:

matching_operator legal_checks_primitive(parameters)

where the legal_checks_primitive is one of the legal checks primitives supported by the tool (established in step S4). This primitive tests attributes of the system or pins of a class and returns a "pass" or "fail" return value based on results. The matching_operator is either a "matching" or "inverse matching" operator, where the "inverse matching" operator causes the return value of the legal_checks_primitive to be inverted. The resulting return code of the statement must be "pass"; a "fail" return code aborts execution of the class-type inference rule.

Descriptions of class-type inference rules hereinafter will use '~' to represent the "matching" operator, and '!~' to represent the "inverse matching" operator.

If all legal checks statements are executed and result in a "pass" return value, then the wiring actions clause is executed, which is the second significant clause. The wiring actions clause contains one or more wiring_action_statements. These statements perform wiring operations, causing interconnections to be made between pins, and sometimes causing additional ASIC cores or logic gates to be instantiated.

A wiring actions statement has the following form:
   wiring_primitive(parameters) assignment_operator wiring_primitive(parameters);

The wiring actions statement has a portion to the left of the assignment operator, known as the left hand side of the statement, and a portion to the right of the assignment operator, known as the right hand side of the statement. Both the left and right hand sides of the statement reference one or more of the wiring actions primitives established at step S4. This disclosure uses the abbreviations Left Hand Side (LHS) and Right Hand Side (RHS) to refer to the corresponding portions of the wiring actions statement. The LHS is executed first, and depending on the results of the selected wiring actions primitives, returns a list of pins. Note that the parameters of the wiring_primitive may, in turn, be calls to other wiring actions primitives in a nested fashion. Also note that a matching clause, defined later, may be substituted for a wiring_primitive in the statement syntax. If the LHS execution results in a list of pins that is not null, then execution of the statement continues with execution of the RHS. Similar to the LHS, the RHS of the equation may contain nested calls to other wiring actions primitives or may containing matching clauses. Certain parameter values are implicitly inherited by wiring action primitives on the RHS based on results from the LHS. These include the number of pins in the pin list resulting from LHS execution, and the attributes of those pins. This inheritance may be used by RHS wiring action primitives to infer properties and adjust execution accordingly. For example, a primitive that generates a group of control register bits can adjust the number of bits generated based on the number of signals in the LHS returned pin list.

Once both the LHS and RHS of the statement have been evaluated, the returned LHS and RHS lists of pins are wired together by execution of the assignment operator. Typically, the LHS pin list is a list of input pins and the RHS pin list is a list of output pins, although this is reversed for some assignment operators (in order to allow for input pins on RHS to inherit properties from output pins on LHS). Various assignment operators are available, and differ in terms of expected number of pins in the LHS and RHS pin lists, and which sides of the equation produce lists of input versus output pins. The following list defines the available illustrative assignment operators:

Scalar assignment (:=<): Wire a single output pin to a list of input pins.

Simple assignment (:=): Wire a list of output pins to a list of input pins of the same length.

Reverse assignment (=:): Same as simple assignment except that LHS pin list is list of output pins and RHS pin list is list of input pins.

Common Vector assignment (:=#): Wires a bit-slice of output pins to multiple bit slices of input pins. Length of input pin list must be an integer multiple of the length of the output pin list.

Mismatched assignment (:=*): Wires list of output pins to list of input pins. Length of pin lists is not restricted. If lengths are mismatched, outputs are assigned to inputs using a round-robin algorithm.

The operators shown in parenthesis above are used to represent the respective operations in the description that follows.

As noted previously, a "matching clause" may be used in place of a wiring action primitive. Matching clauses have the following form:
   {wiring_primitive(parameters)   matching_operator
       matching_primitive(parameters)} where the matching_operator and matching_primitive may be repeated as needed. Matching clauses are processed left to right. Matching_primitives are the subset of wiring action primitives that perform matching functions or binary matching functions. Matching_operators are either the "match" or "inverse-match" operator, where the "inverse-match" operator inverts the results of the subsequent matching_primitive. The wiring_primitive referenced at the start of the clause returns an initial list of pins. Subsequent matching_operators and matching_primitives inherit this list of pins, and either return this list, or a subset of this list, that matches a specified criteria. If no pins match the specified criteria, a null list of pins may be returned. If the LHS of the statement is a matching clause, and this clause returns a null list of pins, then the RHS of the statement is not processed. Matching clauses are used to implement conditional execution of wiring actions based on subsystem and/or pin attributes.

B. Execution of Class-type Inference Rules

The general algorithm for execution of a class-type inference rule is shown below:

```
/* Subroutine to execute class-type */
execute_class-type( selected_class, selected_class-type )
begin
   look up entry for selected_class-type in class-type definitions;
   for each legal checks statement in selected_class-type execute statement;
      if statement return = fail then return error;
      end if;
   end for;
   for each wiring actions statement in selected_class-type
      lhs_pins := parse_and_execute_left_hand_side_of_statement (selected_class);
      if lhs_pins is not null then
         rhs_pins := parse_and_execute_right_hand_side_of_statement (selected_class);
         return_status := execute_assignment_operator (lhs_pins, rhs_pins);
         if return_status = error then
            return error;
         end if;
      end if;
   end for;
   return ok;
end execute_class-type;
```

C. Construction of Class-type Inference Rules

The generic organization of statements within a class-type inference rule can be described as follows:

```
class-type name_of_class-type_rule is
   legal_checks_actions begin
      legal checks statements to verify general structure of pin class;
      legal checks statements to verify that applicable global attributes have
      legal values;
      legal checks statements to verify that rule-defined attributes have
      legal values;
      legal checks statements to verify that user-defined attributes select
      legal values;
   end
   wiring_actions begin
      wiring actions statements to wire pins per global attribute selection (if
      applicable);
      wiring actions statements to wire any remaining unwired pins to exist-
      ing
         inputs of class to output pins (if both inputs and outputs exist);
      wiring actions statements to wire any remaining unwired pins per user-
         defined attribute specification;
```

-continued

```
      wiring actions statements to wire any remaining unwired pins per rule-
         defined default specification;
   end
end_class-type
```

More detailed descriptions follow for the basic class-types of pins described above, and incorporate those sections of the above generic organization as applicable to each case. These descriptions are presented in a generic manner, and make assumptions regarding available primitives in the tool. Requirements for primitives will be discussed below in more detail. Although implementation details may vary in actual systems (based on type of parameters which are significant and alternative priority schemes for applying wiring actions based on these priorities), these generic forms are representative of all of these implementations.

The following class-type is used to wire pins belonging to the "functional datapath" of the subsystem. This general definition assumes there is some global attribute that applies, which may exclude some pins from being wired as part of the datapath. Such a case was noted previously for the illustrative application (i.e., HSS subsystems).

```
class-type functional_datapath_rule is
   legal_checks_actions begin
      ~ check_class_structure (only inputs, only outputs,
         or number of inputs equals number of outputs);
      ~ check_rule_parms (legal values on inputs: tie_to_0, tie_to_1, connect_to_pi);
      ~ check_rule_parms (legal values on outputs: no_connect, connect_to_po);
   end
   wiring_actions begin
      /* If both inputs and outputs exist: Wire input pins to output pins */
      {reorder (use_link_order_for_target_stage, input_pins ( ))
         ~ test_class_structure (output_pins_exist)
         ~ prune_list (find_applicable_global ( ),
         find_global_value )find_applicable_global ( ))}
         := reorder (use_link_order_for_source_stage, output_pins ( ));
      /* If only inputs exist: Wire input pins to primary inputs of subsystem */
      {reorder (use_link_order_for_target_stage, input_pins ( ))
```

```
        ~ test_structure (no_output_pins)
        ~ prune_list (find_applicable_global ( ),
        find_global_value (find_applicable_global ( ))}
        := generate_primary_inputs (target_width ( ));
    /* If only outputs exist: Wire output pins to primary outputs of subsystem */
    {reorder (use_link_order_for_source_stage, output_pins ( ))
        ~ test_class_structure (no_output_pins)
        ~ prune_list (find_applicable_global ( ),
        find_global_value (find_applicable_global ( ))}
        =: generate_primary_outputs (target_width ( ));
    /* Apply default actions to any remaining pins */
    {input_pins ( ) ~ test_rule_parm (tie_to_0) ~ prune_list (unwired_state)}
        :=< generate_logic_0 ( );
    {input_pins ( ) ~ test_rule_parm (tie_to_1) ~ prune_list (unwired_state)}
        :=< generate_logic_1 ( );
    {reorder (use_link_order_for_target_stage, input_pins ( ))
        ~ test_rule_parm (connect_to_pi)
        ~ prune_list (unwired_state)}
        := generate_primary_inputs (target_width ( ));
    {output_pins ( ) ~ test_rule_parm ( no_connect) ~ prune_list (unwired_state)}
        =: generate_noconnect ( );
    {reorder (use_link_order_for_source_stage, output_pins ( ))
        ~ test_rule_parm (connect_to_po)
        ~ prune_list (unwired_state)}
        =:generate_primary_outputs (target_width ( ));
  end
end_class-type
```

Wiring options for the "datapath control/status" class-type of pins are substantially similar to those of the "channel control/status with no common control option" class-type of pins. The following class-type inference rule is used to wire either of these class-types. The general definition, as shown, assumes no global attributes are applicable, and further assumes that wiring to control/status registers is not a permitted default (although it may be specified by the user).

```
class-type datapath_control_rule is
  legal_checks_actions begin
    ~ check_class_structure (only inputs, only outputs,
        or number of inputs equals number of outputs);
    ~ check_rule_parms (legal values on inputs: tie_to_0, tie_to_1, connect_to_pi);
    ~ check_rule_parms (legal values on outputs: no_connect, connect_to_po);
    ~ check_user_parms (legal values on inputs: tie_to_0, tie_to_1,
        connect_to_pi, connect_to_channel_ctl_reg);
    ~ check_user_parms (legal values on outputs: no_connect, connect_to_po,
        connect_to_channel_stat_reg);
  end
  wiring_actions begin
    /* If both inputs and outputs exist: Wire input pins to output pins */
    {reorder (use_link_order_for_target_stage, input_pins ( ) )
        ~ test_class_structure (output_pins_exist)}
        := reorder (use_link_order_for_source_stage, output_pins ( ));
    /* For remaining pins: Wire pins based on user specification, if provided */
    {input_pins ( ) ~ test_user_parm (tie_to_0) ~ prune_list (unwired_state)}
        :=< generate_logic_0 ( );
    {input_pins ( ) ~ test_user_parm (tie_to_1) ~ prune_list (unwired_state )}
        :=< generate_logic_1 ( );
    {reorder (use_link_order_for_target_stage, input_pins ( ) )
        ~ test_user_parm (connect_to_pi)
        ~ prune_list (unwired_state)}
        := generate_primary_inputs(target_width( ));
    {reorder (use_link_order_for_target_stage, input_pins ( ))
        ~ test_user_parm (connect_to_channel_ctl_reg) ~ prune_list
    (unwired_state)}
        := generate_reg_bits (channel_ctl_reg, vector_width ( ));
    {output_pins ( ) ~ test_user_parm (no_connect) ~ prune_list (unwired_state)}
        =: generate_noconnect ( );
    {reorder (use_link_order_for_source_stage, output_pins ( ))
        ~ test_user_parm (connect_to_po)
        ~ prune_list (unwired_state)}
        =:generate_primary_outputs (target_width( ));
    {reorder( use_link_order_for_source_stage, output_pins ( ))
        ~ test_user_parm (connect_to_channel_stat_reg)
        ~ prune_list (unwired_state)}
        =: generate_reg_bits( channel_stat_reg, vector_width( ) );
    /* Apply default actions to any remaining pins */
```

-continued

```
    {input_pins ( ) ~ test_rule_parm( tie_to_0 ) ~ prune_list (unwired_state) }
        :=< generate_logic_0( );
    {input_pins ( ) ~ test_rule_parm( tie_to_1 ) ~ prune_list (unwired_state) }
        :=< generate_logic_1 ( );
    {reorder (use_link_order_for_target_stage, input_pins ( ))
        ~ test_rule_parm (connect_to_pi)
        ~ prune_list (unwired_state)} := generate_primary_inputs (target_width (
));
        {output_pins ( ) ~ test_rule_parm (no_connect) ~ prune_list
    (unwired_state)}
        =: generate_noconnect ( );
    {reorder (use_link_order_for_source_stage, output_pins ( ))
        ~ test_rule_parm (connect_to_po)
        ~ prune_list (unwired_state)}
        =: generate_primary_outputs (target_width ( ));
    end
end_class-type
```

In some cases, expanded options are appropriate for channel control signals, as was described for the "channel control (with optional common control)" class-type of pins. The following class-type inference rule is used to wirepins-belonging to this class-type. This general definition applies to control signals only, and expands options from those in the previous class-type definitions to allow a common primary input(s) or common bit slice of the common control register to drive pins of all channels.

```
class-type extended_channel_control_rule is
    legal_checks_actions begin
    ~ check_class_structure (only inputs, or number of inputs equals number of
outputs,
        or number of inputs is integral times number of outputs);
    ~ check_rule_parms (legal values on inputs: tie_to_0, tie_to_1, connect_to_pi,
        connect_to_common_pi);
    ~ check_user_parms (legal values on inputs: tie_to_0, tie_to_1, connect_to_pi,
        connect_to_common_pi, connect_to_channel_ctl_reg,
        connect_to_common_ctl_reg);
    end
wiring_actions begin
/* If equal numbers of inputs and outputs exist: Wire input pins to output pins */
{reorder (use_link_order_for_target_stage, input_pins ( ))
    ~ test_class_structure( number of inputs inputs equals number of outputs)}
    := reorder (use_link_order_for_source_stage, output_pins ( ));
/* If number of inputs is integral times number of outputs:
    Wire input pins to common set of output pins */
{reorder (use_link_order_for_target_stage, input_pins ( ))
    ~ test_class_structure (number of_inputs is integral times number of
outputs)}
    :=# reorder_using_vector_index_only (output_pins ( ));
/* For remaining pins: Wire pins based on user specification, if provided */
{input_pins ( ) ~ test_user_parm (tie_to_0) ~ prune_list (unwired_state)}
    :=< generate_logic_0 ( );
{input_pins ( ) ~ test_user_parm (tie_to_1) ~ prune_list (unwired_state)}
    :=< generate_logic_1 ( );
{reorder (use_link_order_for_target_stage, input_pins ( ))
    ~ test_user_parm (connect_to_pi)
    ~ prune_list (unwired_state) }
    := generate_primary_inputs (target_width ( ));
{reorder (use_link_order_for_target_stage, input_pins ( ))
    ~ test_user_parm (connect_to_common_pi)
    ~ prune_list (unwired_state)}
    :=# generate_primary_inputs (vector_width ( ));
{reorder (use_link_order_for_target_stage, input_pins ( ))
    ~ test_user_parm (connect_to_channel_ctl_reg)
    ~ prune_list (unwired_state)}
    := generate_reg_bits (channel_ctl_reg, vector_width ( ));
```

```
{reorder (use_link_order_for_target_stage, input_pins ( ))
    ~ test_user_parm (connect_to_common_ctl_reg)
    ~ prune_list (unwired_state)}
    :=# generate_reg_bits (common_ctl_reg, vector_width ( ));
    /* Apply default actions to any remaining pins */
    {input_pins ( ) ~ test_rule_parm (tie_to_0) ~ prune_list (unwired_state)}
        :=< generate_logic_0 ( );
    {input_pins ( ) ~ test_rule_parm (tie_to_1) ~ prune_list (unwired_state) }
        :=< generate_logic_1 ( );
    {reorder (use_link_order_for_target_stage, input_pins ( ))
        ~ test_rule_parm (connect_to_pi)
        ~ prune_list (unwired_state)}
        := generate_primary_inputs (target_width ( ));
    {reorder (use_link_order_for_target_stage, input_pins ( ))
        ~ test_rule_parm (connect_to_common_pi)
        ~ prune_list( unwired_state) }
        :=# generate_primary_inputs (vector_width ( ));
    end
end class-type
```

Pins belonging to the "Common Control/Status" pin class-type may be wired with the following class-type inference rule. This general rule allows control signals to all cores to be driven from either separate or common primary input port(s) or separate or common bit(s) of the common control register. Status signals are always driven to separate primary output port(s) or separate bits of the common status register (or left unconnected). Pins of this class-type are not associated with specific channels, and therefore bit ordering is only done based on vector index values within each core; order of pins for multiple cores will occur in arbitrary order.

```
class-type common_control_rule is
    legal_checks_actions begin
    ~ check_class_structure (only inputs, only outputs,
        or number of inputs is integral times number of outputs);
    ~ check_rule_parms (legal values on inputs: tie_to_0, tie_to_1, connect_to_pi,
        connect_to_common_pi);
    ~ check_user_parms (legal values on inputs: tie_to_0, tie_to_1, connect_to_pi,
        connect_to_common_pi, connect_to_separate_bits_of_common_ctl_reg,
        connect_to_common_ctl_reg);
    ~ check_rule_parms (legal values on outputs: no_connect, connect_to_po);
    ~ check_user_parms (legal values on outputs: no_connect, connect_to_po,
        connect_to_common_stat_reg);
    end
wiring_actions begin
/* If number of inputs is integral times number of outputs:
    Wire input pins to common set of output pins */
{reorder( use_vector_index_only, input_pins ( ))
    ~ test_class_structure (number of_inputs is integral times number of
outputs)}
    :=# reorder( use_vector_index_only, output_pins ( ));
/* For remaining pins: Wire pins based on user specification, if provided */
{input_pins ( ) ~ test_user_parm (tie_to_0) ~ prune_list (unwired_state)}
    :=< generate_logic_0 ( );
{input_pins ( ) ~ test_user_parm (tie_to_1) ~ prune_list (unwired_state)}
    :=< generate_logic_1 ( );
{reorder (use_vector_index_only, input_pins ( ))
    ~ test_user_parm (connect_to_pi)
    ~ prune_list (unwired_state)}
    := generate_primary_inputs (target_width ( ));
{reorder (use_vector_index_only, input_pins ( ))
    ~ test_user_parm (connect_to_common_pi)
    ~ prune_list (unwired_state)}
    :=# generate_primary_inputs (vector_width ( ));
{reorder (use_vector_index_only, input_pins ( ))
    ~ test_user_parm (connect_to_separate_bits_of_common_ctl_reg)
    ~ prune_list( unwired_state) }
    := generate_reg_bits (common_ctl_reg, target_width ( ));
```

-continued

```
{reorder (use_vector_index_only, input_pins ( ))
   ~ test_user_parm (connect_to_common_ctl_reg)
   ~ prune_list( unwired_state ) }
   :=# generate_reg_bits (common_ctl_reg, vector_width ( ));
{output_pins ( ) ~ test_user_parm (no_connect) ~ prune_list (unwired_state)}
   =: generate_noconnect ( );
{reorder (use_vector_index_only, output_pins ( ))
   ~ test_user_parm (connect_to_po)
   ~ prune_list (unwired_state)}
   =: generate_primary_outputs (target_width ( ));
{reorder (use_vector_index_only, output_pins ( ))
   ~ test_user_parm (connect_to_common_stat_reg )
   ~ prune_list (unwired_state)}
   =: generate_reg_bits (common_stat_reg, target_width ( ));
/* Apply default actions to any remaining pins */
{input_pins ( ) ~ test_rule_parm (tie_to_0) ~ prune_list (unwired_state)}
   :=< generate_logic_0 ( );
{input pins ( ) ~ test_rule_parm (tie_to_1) ~ prune_list (unwired_state) }
   :=< generate_logic_1 ( );
{reorder( use_vector_index_only, input_pins ( ))
   ~ test_rule_parm (connect_to_pi)
   ~ prune_list (unwired_state)}
   := generate_primary_inputs (target_width ( ));
{reorder (use_vector_index_only, input_pins ( ))
   ~ test_rule_parm (connect_to_common_pi)
   ~ prune_list (unwired_state)}
   :=# generate_primary_inputs (vector_width ( ));
{output_pins ( ) ~ test_rule_parm (no_connect) ~ prune_list (unwired_state)}
   =: generate_noconnect ( );
{reorder (use_vector_index_only, output_pins ( ))
   ~ test_rule_parm (connect_to_po)
   ~ prune_list (unwired_state)}
   =: generate_primary_outputs (target_width ( ));
end
end_class-type
```

Class-type inference rules for the test pins class-type generally apply a specific wiring action with no user options. Examples of such rules would be specific to the manufacturing test requirements for the core and, accordingly, are not described herein in detail. Also, examples of special cases are not provided, as any such example would not have generic application.

The general class-types and class-type inference rule details provided are applicable for the illustrative datapath HSS subsystem. It is understood that other embodiments are possible that apply to other applications, make additional use of global attributes, use attributes to effectively implement if-then-else firing of wiring actions statements, use additional attribute definitions or attribute values, or limit options available for some pin classes. The illustrative example of the invention groups pins into class-types generally and uses pin attributes to determine sub-class-types for wiring. It is also understood that an equivalent implementation may define class-types on a more granular basis and thereby imply attribute values. Mixtures of these techniques are also possible.

D. Primitives

The class-type inference rules defined previously assumed the existence of a minimum set of primitives supported by the software tool to which the invention will be applied. As will be described later, the invention may also include a step of establishing a set of primitives as required for implementation of class-type inference rules.

Primitives fall into the following class-types: string functions, legal checks primitives, matching function primitives, wiring action primitives, and assignment operators. This section describes this minimum functionality within the tool, using function names and syntax that are consistent with the previous class-type descriptions. It is understood that the disclosed invention is not dependent on this particular syntax, nor does this description preclude software from supporting additional functions.

1) String Functions:

Primitives that return strings that may be used as parameters for other functions are called "string functions." In the previous descriptions of class-types, the following functions fall into this category:

find_applicable_global ( ): Returns the name of the global attribute that is to be applied for the class currently being executed.

find_global_value ( ): Returns the value of the global attribute corresponding to the global name specified.

Other string functions are possible to determine: class name being executed, values of user or rule defined wiring action modifiers, etc.

2) Legal Checks Primitives:

Legal checks primitives are used in statements of the legal checks clause. Such primitives return a "pass" or "fail" condition code. The following primitives are required by the previous class-type descriptions:

check_class_structure ( ): This primitive checks that the number of input and output pins of the class meet the assumptions necessary to ensure successful execution of the class-type. Various tests may be selected to check whether input pins or output pins exist, the relationship between the number of input pins and the number of output pins, etc.

check_rule_parms ( ): This primitive checks whether the rule-defined wiring action values are legal for the class-type. The primitive may check input and output pins separately, or may check all pins.

check_user_parms ( ): This primitive checks whether the user-defined wiring action values are legal for the class-type. The primitive may check input and output pins separately, or may check all pins.

In addition, a primitive is required to check global attributes. This primitive was not used in the above class-type descriptions, but is required for a generic solution:

check_global ( ): This primitive can be used to check whether a global is defined, and whether the global value is one of a set of legal values.

3)Matching Function Primitives:

Matching function primitives are used in matching clauses to prune the number of pins in a pin list. The pin list produced by the function immediately to the left of the matching function in the matching clause is an implied input to the matching function. The matching function returns either this same list of pins, or a subset of these pins. Some matching functions are binary, testing a condition and either returning the entire input list of pins, or returning a null list. Other matching functions test characteristics of individual pins within the input list of pins, and return only those pins which meet the specified criteria. The following matching functions are required by the previous class-type descriptions:

test_class_structure ( ): This is a binary matching function that tests that the number of input and output pins of the class meet some specified criteria. Various tests may be selected to check whether input pins or output pins exist, the relationship between the number of input pins and the number of output pins, etc.

test_global ( ): This is a binary matching function which tests that the specified global attribute is defined and has a specified value.

prune_list ( ): This matching function tests some characteristic of the input list of pins based on the selected criteria. In the previous class-type descriptions, the only criteria specified is to test the wiring state of the pins and return those pins, which are unwired. Other criteria are also possible, such as testing whether the pin(s) connect to primary inputs/outputs, control registers, etc.

test_user_parm ( ): This matching function tests the user-defined wiring actions specified for the input list of pins, and returns those pins which match the specified value.

test_rule_parm ( ): This matching function tests the rule-defined wiring actions specified for the input list of pins, and returns those pins which match the specified value.

4) Wiring Action Primitives:

Wiring action primitives are functions that perform some action relative to wiring, and return a list of pins. The following wiring action primitives search the design space and return lists of existing pins:input_pins ( ): Returns a list of all input pins in the class currently being executed.

output_pins ( ): Returns a list of all output pins in the class currently being executed.

Similar primitives may be provided for bidirectional pins, or pins meeting other specialized criteria. The following wiring action primitive modifies a specified list of pins:

reorder ( ): This primitive has parameters which specify a list of pins, and a link order to use as reference. The pin attributes of the pins in the list are examined, and the pins are reordered within the list based on the link order. If more than one pin exists on the same core instance with the same channel id, then these pins are reordered based on their respective vector index. (It is also possible to reorder pins solely based on vector index.)

The following wiring action primitives generate logic within the design and return a list of pins:generate_logic_0 ( ): Generates a list of output pins which are tied to a logic 0 level. Note that the logic structure for this tie down function may vary, and multiple structures may be available (i.e. tie to GND net, tie to pull-down cell, tie to SRL with input tied to GND, etc.).

generate_logic_1 ( ): Generates a list of output pins which are tied to a logic 1 level. Note multiple logic structures are possible, similar to the description of generate_logic_0 ( ).

generate_noconnect ( ): Generates a list of input pins which are terminated. Note that the logic structure for this no-connect function may vary, and multiple structures may be available (i.e. tie to terminator cell, leave unconnected, tie to observation SRL, etc.).

generate_primary_inputs ( ): Generates primary inputs to the subsystem. Primary inputs of the subsystem are represented as output pins of the design "origin" within the software. Therefore this function returns a list of output pins.

generate_primary_outputs ( ): Generates primary outputs to the subsystem. Primary outputs of the subsystem are represented as input pins of the design "origin" within the software. Therefore this function returns a list of input pins.

generate_reg_bits ( ): Generates a slice of register bits of the specified length within the specified register(s). For control registers, this function returns a list of output pins for the corresponding register flip-flops. For status registers, this function returns a list of inputpins for the corresponding register flip-flops.

5)Assignment Operators:

The various assignment operators were described above. The function of these operators is supported within the tool as additional primitives.

4. Fourth Step: Establish Primitives

In a fourth step S4, a set of primitives, as necessary to implement the class-type inference rules, is established. The primitives can be established for each tool built, or a tool can be select from a set of primitives that have already been built.

III. Operation

In operation, the user establishes the ASIC cores that are to be instantiated in the target application, the link order that prioritizes channel identifiers for connection at each datapath stage, and values of "global attributes" and "user-defined wiring actions," as needed for the target application. A tool supporting the set of primitives, established at step S4, is used to read the core/pin rules written in step S2, and executes the class-type inference rules generated at step S3. The pin attributes in the core/pin rules, in conjunction with the user's specification of core selection, link orders, global attribute values, and user-defined wiring actions, allows inference of proper wiring of the subsystem. The output of the tool is a wired subsystem containing the selected cores with appropriate interconnections.

IV. Conclusion

In the previous discussion, it will be understood that the method steps discussed are performed by a processor of a computer system executing instructions of a program product stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for building an automated datapath system generating tool for a datapath system including bit-sliced data between at least one source stage and at least one subsequent stage that are connected across a channel, the method comprising the steps of:

defining at least one system characteristic;

generating a core/pin rule for the design that defines each core of the design, each pin of each core and corresponding pin attributes, the core/pin rule defining a class of each pin; and constructing class-type inference rules based on the definition of the class of each pin for automatically generating the datapath system, each class-type inference rule executing at least one primitive function;

wherein the pin attributes include a class and a channel of the pin, and the core/pin rule generating includes bundling pins based on the class attributes and the channel attributes thereof, respectively, the bundling based on the class attributes being orthogonal to the bundling based on the channel attributes.

2. The method of claim 1, wherein the defining step includes:

defining a set of cores to be used in the datapath system, and defining each stage of each core; and establishing a link order name for each stage.

3. The method of claim 2, wherein the defining step further includes identifying any global attributes for a plurality of pins.

4. The method of claim 1, wherein the core/pin rule generating step includes:

bundling pins of each stage according to at least one class, each class indicating a common wiring parameter for the pins;

categorizing each class as one of a plurality of datapath system class-types;

bundling pins according to at least one channel identifier; and generating the core/pin rule that defines each core of the design, each pin of each core and corresponding pin attributes.

5. The method of claim 4, further comprising the step of assigning a vector index to each pin within a multiple pin core having more than one pin with the same class and channel identifier, wherein the vector index is a pin attribute.

6. The method of claim 4, further comprising the steps of bundling pins according to at least one global attribute, each global attribute indicating a common global parameter of the pins.

7. A system for building an automated datapath system generating tool for a datapath system including bit-sliced data between at least one source stage and at least one subsequent stage that are connected across a channel, the method comprising the steps of:

means for defining at least one system characteristic;

means for generating a core/pin rule for the design that defines each core of the design, each pin of each core and corresponding pin attributes, the core/pin rule defining a class of each pin; and means for constructing class-type inference rules based on the definition of the class of each pin for automatically generating the datapath system, each class-type inference rule executing at least one primitive function;

wherein the pin attributes include a class and a channel of the pin, and the core/pin rule generating includes bundling pins based on the class attributes and the channel attributes thereof, respectively, the bundling based on the class attributes being orthogonal to the bundling based on the channel attributes.

8. The system of claim 7, wherein the defining means includes:

means for defining a set of cores to be used in the datapath system, and defining each stage of each core;

means for establishing a link order name; and means for identifying any global attributes for a plurality of pins.

9. The system of claim 7, wherein the core/pin rule generating means includes:

means for bundling pins of each stage according to at least one class, each class indicating a common wiring parameter for the pins;

means for categorizing each class as one of a plurality of datapath system class-types;

means for bundling pins according to at least one channel identifier; and means for generating the core/pin rule that defines each core of the design, each pin of each core and corresponding pin attributes.

10. The system of claim 9, further comprising means for assigning a vector index to each pin within a multiple pin core having more than one pin with the same class and channel identifier, wherein the vector index is a pin attribute.

11. The system of claim 9, further comprising means for bundling pins according to at least one global attribute, each global attribute indicating a common global parameter of the pins.

12. A computer program product comprising a computer useable medium having computer readable program code embodied therein, which when executed, causing a computer to build an automated datapath system generating tool for a datapath system including bit-sliced data between at least one source stage and at least one subsequent stage that are connected across a channel, the program product comprising program code, which when executed, configured to:

define at least one system characteristic;

generate a core/pin rule for the design that defines each core of the design, each pin of each core and corresponding pin attributes, the core/pin rule defining a class of each pin; and construct class-type inference rules based on the definition of the class of each pin for automatically generating the datapath system, each class-type inference rule executing at least one primitive function;

wherein the pin attributes include a class and a channel of the pin, and the core/pin rule generating includes bundling pins based on the class attributes and the channel attributes thereof, respectively, the bundling based on the class attributes being orthogonal to the bundling based on the channel attributes.

13. The program product of claim 12, wherein the defining code includes:

program code configured to define a set of cores to be used in the datapath system, and defining each stage of each core; and program code configured to establish a link order name.

14. The program product of claim 13, wherein the defining code further comprises program code configured to identify any global attributes for a plurality of pins.

15. The program product of claim 12, wherein the core/pin rule generating code includes:

program code configured to bundle pins of each stage according to at least one class, each class indicating a common wiring parameter for the pins;

program code configured to categorize each class as one of a plurality of datapath system class-types;

program code configured to bundle pins according to at least one channel identifier; and program code configured to generate the core/pin rule that defines each core of the design, each pin of each core and corresponding pin attributes.

16. The program product of claim 15, further comprising program code configured to assign a vector index to each pin within a multiple pin core having more than one pin with the same class and channel identifier, wherein the vector index is a pin attribute.

17. The program product of claim 15, further comprising program code configured to bundle pins according to at least one global attribute, each global attribute indicating a common global parameter of the pins.

18. The method of claim 1, further comprising establishing a set of primitive functions for use in constructing the class-type inference rules.

19. The system of claim 7, further comprising means for establishing a set of primitive functions for use in constructing the class-type inference rules.

20. The program product of claim 12, further comprising program code configured to establish a set of primitives for use in constructing the class-type inference rules.

* * * * *